United States Patent [19]
Brooks et al.

[11] Patent Number: 5,525,913
[45] Date of Patent: Jun. 11, 1996

[54] POWER VALIDATION TOOL FOR MICROPROCESSOR SYSTEMS

[75] Inventors: William O. Brooks; Gerald A. Budelman, both of Aloha, Oreg.

[73] Assignee: Intel Corporation, Santa Clara, Calif.

[21] Appl. No.: 325,879

[22] Filed: Oct. 19, 1994

[51] Int. Cl.$^6$ .................................................. G01R 31/36
[52] U.S. Cl. ...................... 324/771; 324/158.1; 324/73.1; 364/578
[58] Field of Search .................................. 324/73.1, 158.1, 324/426, 433, 713, 537, 771; 340/660, 661, 636; 307/38, 41, 52; 364/578

[56] References Cited

U.S. PATENT DOCUMENTS

| | | | |
|---|---|---|---|
| 3,849,726 | 11/1974 | Justice | 324/73.1 |
| 4,042,830 | 8/1977 | Kellenbenz et al. | 324/158.1 |
| 4,357,574 | 11/1982 | Takamisawa et al. | 324/771 |
| 5,397,999 | 5/1995 | Kanamaru | 324/771 |
| 5,418,708 | 5/1995 | Nairus | 363/65 |

FOREIGN PATENT DOCUMENTS 6382371  4/1988  Japan ................................. 324/771

Primary Examiner—Kenneth A. Wieder
Assistant Examiner—Diep Do
Attorney, Agent, or Firm—Blakely, Sokoloff, Taylor & Zafman

[57] ABSTRACT

A power validation tool is used in place of an actual microprocessor to validate a power source to determine if the power source is capable of meeting power requirements of the microprocessor. The validation tool is placed into a socket reserved for the microprocessor. A pulse generator supplies a pulse signal to toggle a load between minimum and maximum load current values, while a window comparator monitors the voltage to determine if the load change causes the source voltage to rise above or fall below an accepted range.

12 Claims, 6 Drawing Sheets

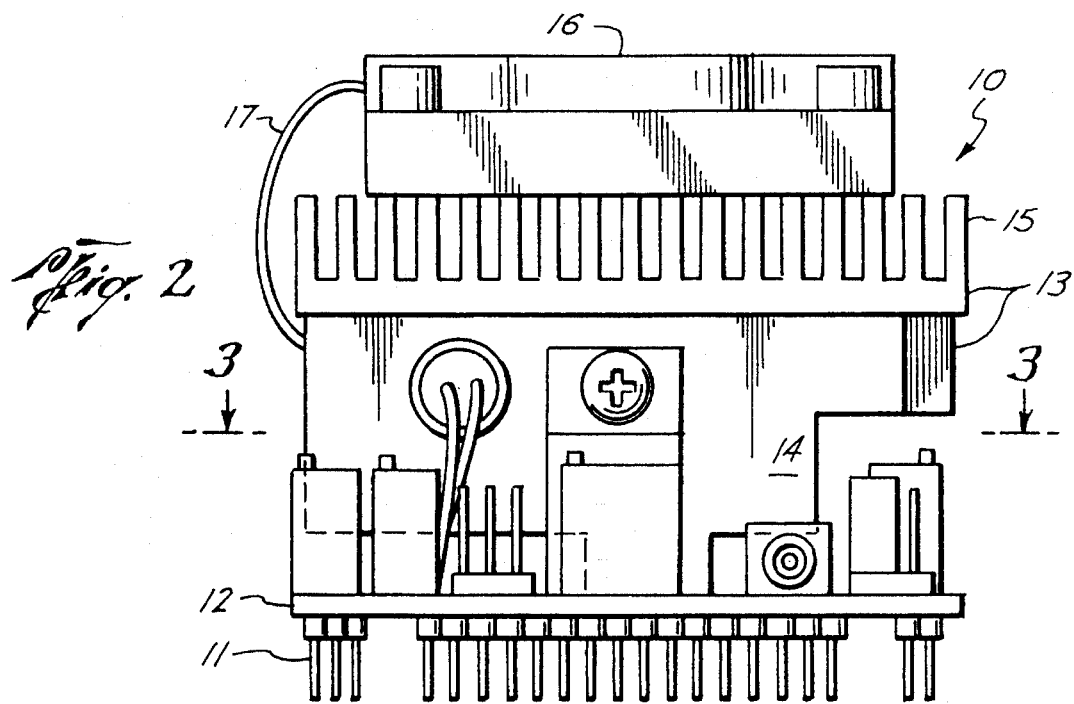
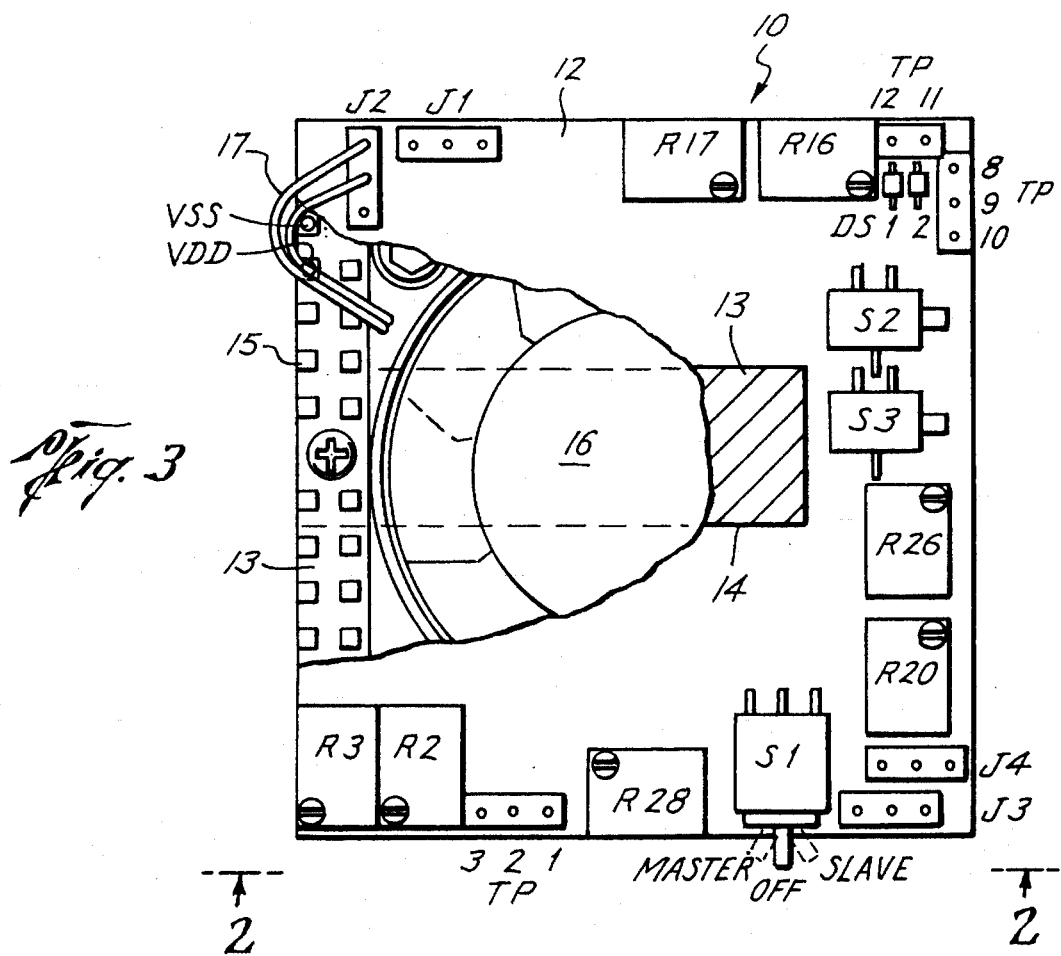

POWER VALIDATION TOOL FOR MICROPROCESSOR SYSTEMS

BACKGROUND OF THE INVENTION

1. Field of the Invention

The present invention relates to the field of semiconductors and, more particularly, to tools for validating power requirements associated with microprocessors.

2. Prior Art

An overwhelming demand is being placed on power systems of current and future generations of personal computers (PCs), as well as on other computing devices utilizing microprocessors. Newer and higher performance processors generally require more power, yet operate at reduced voltage levels. Additional power requirements are due to a number of reasons, but primarily due to the sheer number and density of transistors being packaged on a chip, coupled with the requirement of operating at a much faster clock frequency. Thus, enhancements in computing speed and capability of a microprocessor place considerable constraint on a power supply (or system) providing the necessary power for operating the processor.

With the advent and proliferation of laptop, notebook, sub-notebook, pocket and hand-held computers, a trend has been to include power management functions for use on microprocessors and peripherals in the PC. Power management is required to extend the battery life of portable computers. Reduced power consumption also aids in reducing heat dissipation, as well as lowering the energy costs associated with the operation of a PC. These energy cost reduction constraints will be more pronounced in the future as the computer industry attempts to become "environmentally friendly" or more "green."

Although power management functions have their benefits, these requirements place severe constraints on the power supply. A PC "waking" from its "dormant" (or "sleep") state to its fully operational state can transition from a few milliamperes to several amperes in a very short span of time. For example, one power managed microprocessor has a minimum current draw of approximately 1 mA and a maximum current draw of approximately 1.2 A. An almost instantaneous change from minimum to full maximum current results in a significantly high current transition, which is referenced as di/dt. In the example above, a change of 1 mA to 1.2 A in a matter of 100 nanoseconds results in a di/dt of approximately $1.2 \times 10^7$ A/sec. ((1.2 A–1 mA) $\div 100^{-9}$ sec.), which is quite significant. The di/dt problem is exacerbated when processors are made to operate at lower supply voltages, since the current drawn is increased in order to provide the same amount of power to the processor. This increase in current will then result in a higher di/dt.

It is evident from the above description that future microprocessors and PCs will require power supplies that can cope with these constraints. A typical low cost switching power supply, such as is found in current state-of-the-art PCs, is not designed for low minimum loads nor can it maintain regulation when the load changes rapidly over a significant range, such as when a processor undergoes a power management transition. The power supply can have a poor level of transient response that can lead to apparently random failures of the processor. While this failure may not permanently damage the processor, it can result in lost data. Diagnosing repeated failures may be extremely difficult, since such problems will more than likely be dependent on the software executing the power routine. In some instances, poor transient response can cause the supply voltage to rise to dangerous levels and may in fact damage components, including the microprocessor. In any event, failures due to poor response by the power supply are not acceptable from a reliability perspective.

In order to ensure that adequate power supply capabilities exist for a system, it is preferable to test a given power supply under operating conditions. Therefore, an OEM (original equipment manufacturer) can manufacture a system (component or an assembly), which includes a microprocessor, and test for the desired power requirements. Adequate power supplies can then be selected or designed in conjunction with "cycling" the processor through its various power transitions. However, this assumes that a fully functional microprocessor is available for such tests.

An alternative approach is to simulate the power requirements of a microprocessor by utilizing some form of hardware or software emulation. However, such emulation will necessarily take some amount of engineering on the part of the OEM to emulate the power requirements of the microprocessor. The present invention, on the other hand, is a power validation tool (or device) that is designed to be a physical substitute for the microprocessor from a power perspective, in order to determine the response characteristics of the power supply.

SUMMARY OF THE INVENTION

The present invention describes a power validation tool for use in place of an actual microprocessor or other semiconductor device to validate a power source to determine if the power source is capable of meeting power requirements of the microprocessor. The validation tool is placed into a socket reserved for the microprocessor in order to place a load on the power source, wherein the load is a dynamic load emulating that of the microprocessor when it is coupled to the power source.

A pulse generator supplies a pulse signal of a set frequency for toggling the load between minimum and maximum load current values, that correspond to minimum and maximum currents drawn by the microprocessor. The frequency and the duty cycle of the pulsed signal are made adjustable. The minimum and maximum current settings are also adjustable. A window comparator monitors the voltage of the power source to determine if the load change causes the source voltage to rise above an upper threshold voltage or fall below a lower threshold voltage. The two threshold levels are adjustable as well, so that these threshold voltages can be set to the minimum and maximum acceptable voltage levels of the microprocessor. If the source voltage deviates outside of the acceptable range, a fault indication is noted.

Economic Advantage: By providing a means to test a system or power source for power requirements of the microprocessor, systems can be validated prior to the introduction of the microprocessor. Further, if such validation tools are provided to conform to the specifications of the microprocessor and if the component manufacturer produces the validating tool, system designers need not spend the effort to recreate tools of their own, which tools may or may not meet all of the requirements of the microprocessor. Thus, significant lead time is saved and engineering effort is reduced or not replicated, potentially resulting in economic savings.

BRIEF DESCRIPTION OF THE DRAWINGS

FIG. 2 is an elevation view of one side of the power validator of FIG. 1.

FIG. 3 is a top elevation view of the power validator of FIG. 1 and showing locations of switches, terminals and variable resistors utilized in testing a system under test.

DETAILED DESCRIPTION OF THE PREFERRED EMBODIMENT

A power validation tool for applying a changing load to a power system and dynamically observing the resulting response is described. In the following description, numerous specific details are set forth, such as specific devices, measuring techniques, voltage values, etc., in order to provide a thorough understanding of the present invention. However, it will be obvious to one skilled in the art that the present invention may be practiced without these specific details. In other instances, well known techniques and structures have not been described in detail in order not to unnecessarily obscure the present invention. It is to be noted that a preferred embodiment of the present invention is described, however, it is readily understood that other embodiments can be designed and implemented without departing from the spirit and scope of the present invention. Furthermore, it is appreciated that the present invention need not be limited to the emulation of microprocessors only, but can be used in applications for validating power requirements of other integrated circuit devices.

A power validator of the present invention functions by replacing a microprocessor in a system which is to be tested. It is preferred to have the power validator configured to have the same "footprint" and "pin-out" as the microprocessor being replaced. Thus, the power validator can be made to fit into the socket designed to accept the microprocessor and "mimic" the microprocessor in terms of power requirements and response. The power validator is designed so that the minimum and maximum current draws can be adjusted to correspond to a given microprocessor being emulated. Minimum and maximum voltage limits are also adjustable in order to characterize the response of the power supply to changes in the current drawn. Other adjustments are also available in order to allow for varying characteristics of the microprocessor being emulated. Essentially, the power validator functions as the microprocessor in terms of power requirements without the actual presence of the microprocessor itself.

Figure 1:
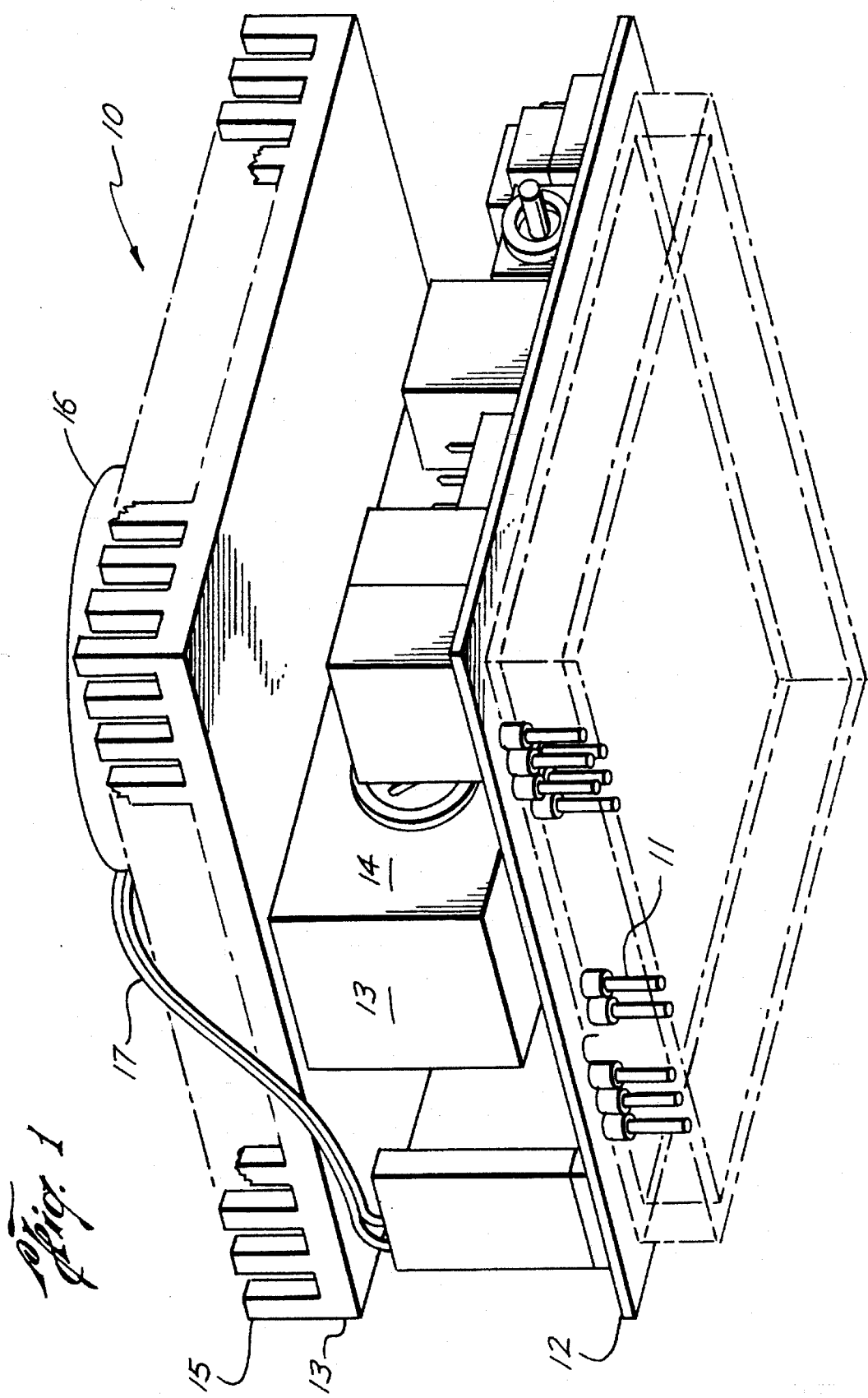
FIG. 1 is a pictorial illustration of a power validator of the present invention.

Referring to FIGS. 1, 2 and 3, a power validator tool 10 of the present invention is shown. This particular power validator 10 shown is designed to fit into a socket which accepts a microprocessor manufactured by Intel Corporation. However, it is appreciated that the validator 10 can be readily adapted for other microprocessors or for many other semiconductor devices as well. As noted by terminal connections 11 located on the underside of a substantially square circuit board 12 of the validator 10, the connections 11 fit into the socket reserved for a microprocessor. However, as earlier stated, the actual physical configuration is a design choice and may differ significantly depending on the particular device being emulated. The physical shape and size are also a design choice, but it is preferred that the validator 10 not have a "footprint" (base dimension) dissimilar from the processor which it is emulating. The height of the validator 10 will typically be taller than the processor, but such height should be maintained reasonably to a minimum.

As is noted in FIGS. 1 and 2, the various components are disposed on the circuit board 12. A heat sink 13 is also mounted on the circuit board 12 for dissipating the generated heat when validator 10 is in operation. Heat sink 13 is comprised of two sections 14 and 15. A lower portion 14 of the heat sink 13 is mounted on the board 12 and disposed toward the interior of the validator 10. Circuit components requiring heat dissipation are attached to lower portion 14. The upper portion 15 of the heat sink 13 resides above the lower portion 14 and is finned to provide maximum surface area for dissipation of heat. A fan 16 is mounted atop the upper portion 15 for further removing heat from the validator 10. Power to the fan is provided from the circuit board 12, as noted by the wire 17 connections from the fan 16 to J2 on the board 12. The size of the heat sink 13, as well as the use of a fan 16 are determined by the amount of heat generated by the validator 10.

FIG. 3 shows the placement of the various terminals, test points, switches and variable resistors which are used during a power validation process. The circuit reference symbols correspond to those identified in the circuit schematic of FIGS. 5A–C. It should also be noted that the actual placement of circuit components, as well as the circuit itself is a design choice. The validator 10, as shown in FIGS. 1–3, is a compact device which plugs into the socket reserved for the microprocessor and the validator 10 emulates the microprocessor in terms of its power requirements. Thus, a power source for the microprocessor, which is usually a power supply within a computer system, provides power to the validator 10 as it would provide power to the microprocessor, if present. The power connections to the target supply under test are shown as VDD and VSS on FIG. 3 and it is critical that the terminal connections which are normally used for providing power to the microprocessor (for example, VDD and VSS) also provide the same power connections to the validator 10. Essentially, the power pins to the validator 10 must match the power pins of the microprocessor being emulated. The non-power pins of the of the validator are not used for the validation process.

In order to power the validator, an additional power source is needed. Although the VDD and VSS supply could be used, it is preferable to use this source strictly for validation purpose. The additional supply will provide the necessary power to the power validator 10 for powering its circuitry. Thus, this allows VDD and VSS to be used strictly for the validation purpose. In the preferred embodiment, the additional supply (not shown) is a +12 volt source connected to J1 of the validator 10.

Figure 4:
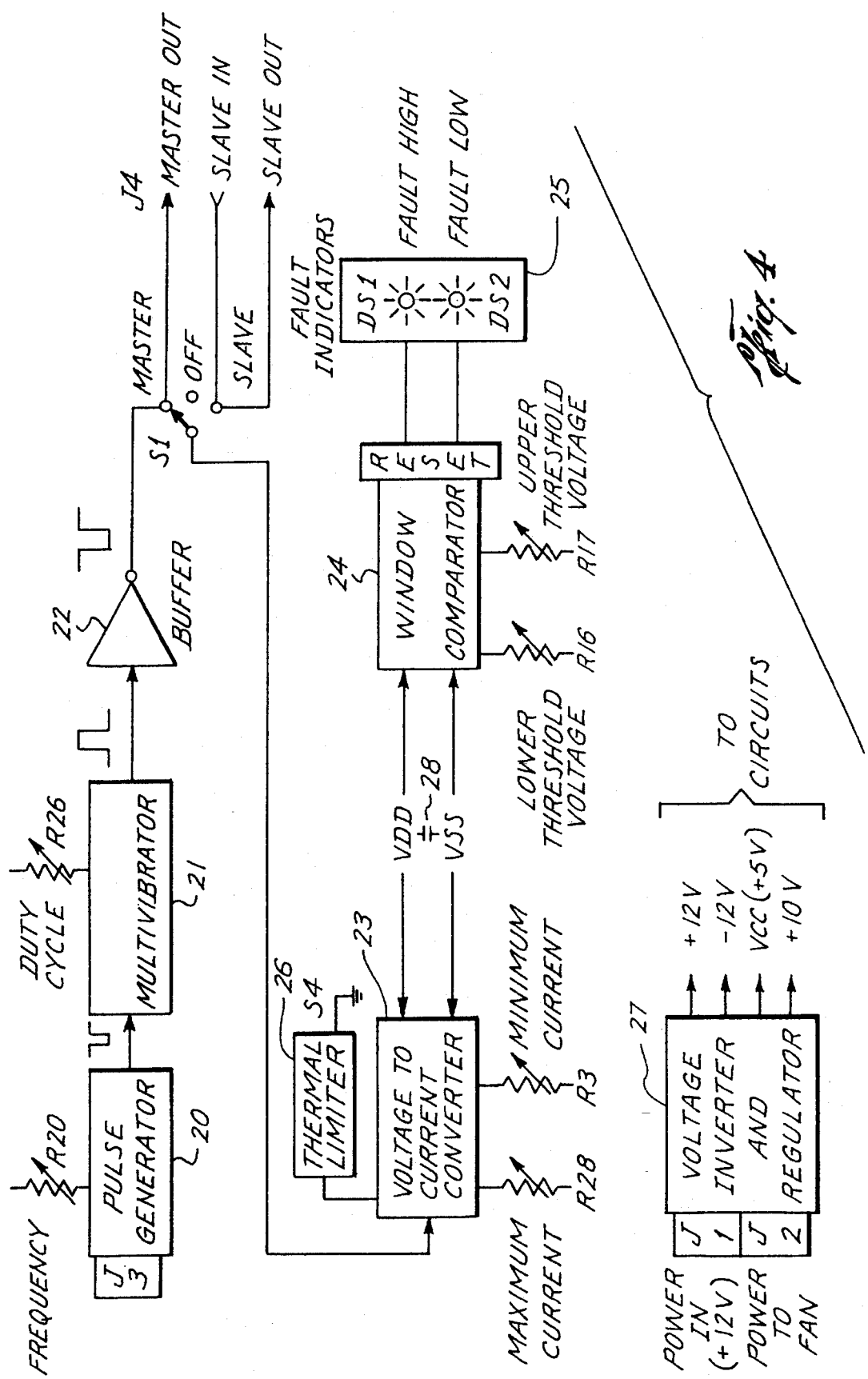
FIG. 4 is a circuit block diagram of the power validator of the preferred embodiment.
Figure 5A:
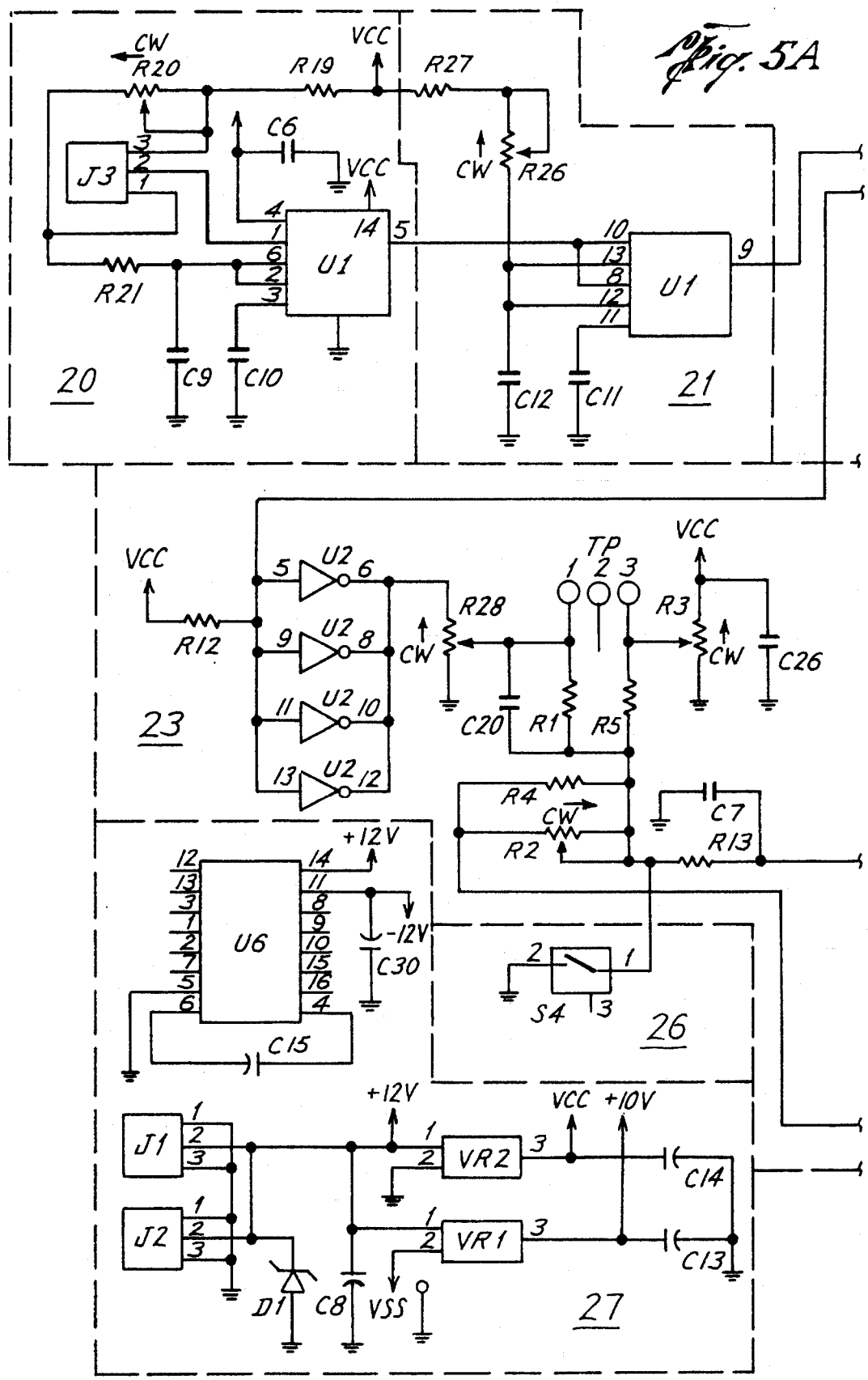
FIGS. 5A, 5B and 5C show a circuit schematic diagram of the preferred embodiment.
Figure 5B:
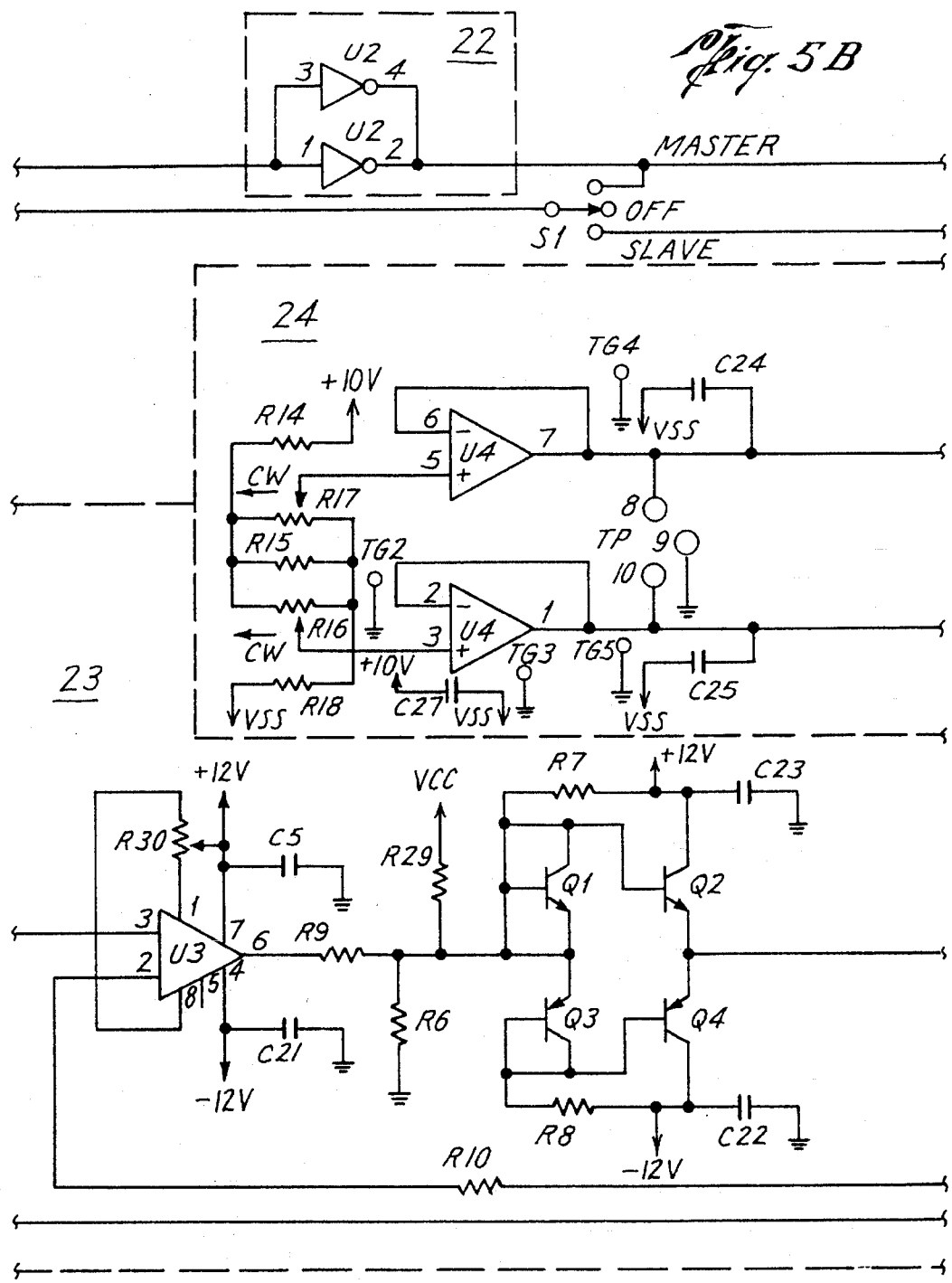
Figure 5C:
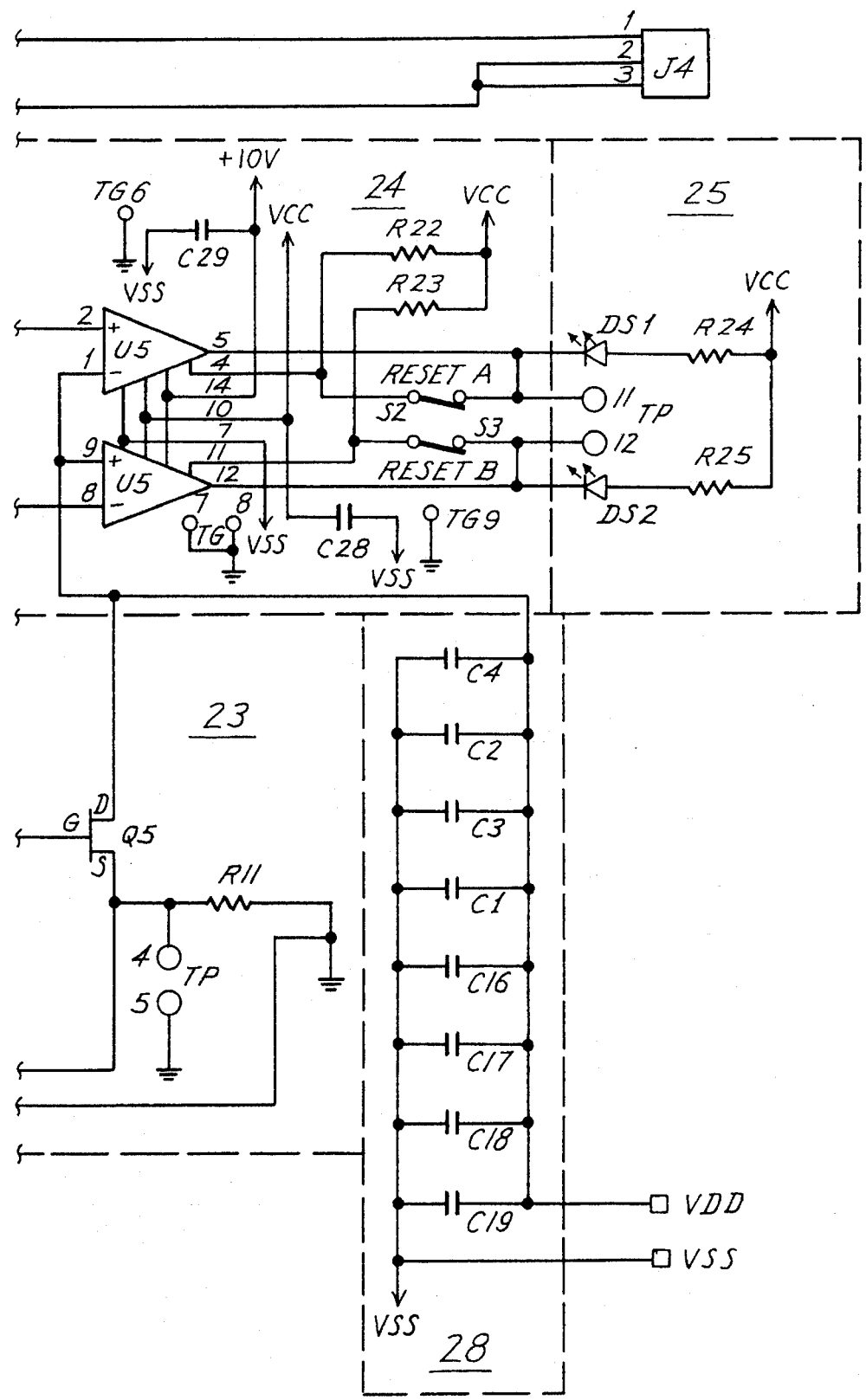

Referring to FIG. 4, a block circuit diagram of the validator 10 is shown. FIGS. 5A–C show the circuit schematic diagram of the validator 10. Furthermore, component designation and values for the circuit of FIGS. 5A–C are identified at the end of the description. Each of the blocks of FIG. 4 are identified as well in FIGS. 5A–C. Again, it is to be stressed that the circuit shown is but one way of implementing the present invention. The overall function of the validator 10 is to establish a well controlled and varying current load on a system under test. This load has a minimum value and a maximum value. Each can be set by the user. The load is made to toggle between the minimum and maximum current values at a frequency and duty cycle that can also be set by the user. Upper and lower voltage limits of the system are also set by the user and monitored by the validator when under test. If either of the voltage limits are exceeded by the system when under load test, then an indication of such failure is made known to the user.

The operation of the preferred embodiment is described below. A pulse generator 20 is used to generate a continuous cycle of pulses at a given frequency. The frequency of the pulses is adjustable and is selected by adjusting R20. The set frequency is referred to as the toggle frequency, since this frequency determines the rate of toggle between maximum and minimum current. The output of the pulse generator 20 is then coupled to a multivibrator 21, which is used to vary the duty cycle of the pulse "train" at the output of the multivibrator 21. The duty cycle is set by adjusting R26. As configured in FIGS. 5A–C, R20 sets the frequency of the pulses and R26 sets the duty cycle of the pulses. The duty cycle determines the percentage of time that the validator 10 spends drawing maximum current. Thus, increasing the duty cycle will result in the increase of power dissipation.

As configured, the frequency of the circuit of FIGS. 5A–C can be made to toggle between 100 Hz to 50,000 Hz generally and between 250 Hz to 10,000 Hz for 50% duty cycle. The duty cycle is generally adjustable between 15% and 95%. Typically, a duty cycle of 50% will suffice for validating most systems. A 50% duty cycle can be obtained by placing a jumper connection between J3-2 and J3-3 and adjusting R26 fully counter-clockwise. The duty cycle is made adjustable by placing a jumper connection only between J3-1 and J3-2, which allows R26 to set the duty cycle. The duty cycle and the toggle frequency can be observed for adjusting by placing an oscilloscope probe between J4-1 and TP2 (current ground).

Next, the output of the multivibrator 21 is coupled through an inverted buffer 22 to switch S1. Switch S1 determines if a particular validator unit operates in either a master mode or a slave mode when used in a multi-processor environment, as will be explained below. In a typical single processor system, switch S1 is set to the "master" position so that the output of buffer 22 is coupled to a voltage-to-current converter/driver circuit 23.

The converter/driver 23 is driven by the input pulses and is made to toggle between a minimum current setting and a maximum current setting at the toggle rate and duty cycle determined by the voltage of the input pulses. The converter/driver 23 is comprised of a converter stage (prior to U3) followed by a current driver stage (noted by Q1–Q5). The power source under test is coupled as VDD and VSS to converter/driver 23. Transistor Q5 presents a dynamic load to the system (or supply) under test.

Operational amplifier U3 is a high slew rate operational amplifier (45 V/usec.) that drives a high current, push-pull driver stage Q1–Q4. This drives the dynamic load Q5, which is a low Rds on field-effect transistor. FET Q5 is mounted onto the heat sink 13 in order to dissipate the generated heat when in operation. Since it is essential to minimize inductance in the dynamic load and especially in the source circuit of Q5, an on-board (etched in copper alloy), low resistance (<0.01 ohm) shunt R11 is used to couple the source of Q5 to ground.

The minimum and maximum current settings are made adjustable by R3 and R28, respectively. R3 sets the minimum current level for performing a power validation test. R28 sets the maximum current level for performing a power validation test. It should be noted that R28 is actually an incremental adjustment for setting the maximum current. That is, R28 sets a current level which is an incremental value above the minimum value set by R3.

It is to be appreciated that the minimum and maximum current calibration and settings are strictly a design choice and the actual value will depend on the particular device being emulated. In the particular circuit of FIGS. 5A–C, the minimum current level is adjustable between 0 to 5 A by the adjustment of R3. Then, R28 is adjusted for an incremental value setting between 0 to 10 A above the minimum current setting.

The VDD and VSS terminals are also coupled to a window comparator 24 for monitoring the voltage between VDD and VSS supplied by the source under test, while the load is made to vary between the two current extremes by converter/driver 23. Comparator 24 is comprised of two stages of comparators, wherein one looks for a lower threshold voltage, while the other looks for an upper threshold voltage. Essentially, it looks for a "window" framed between the two threshold values.

The lower threshold voltage is set by coupling a voltmeter between TP10 and TP9 and adjusting R16. A voltage value on the voltmeter corresponds to the lower setting. Thus, R16 is adjusted until a voltage corresponding to the lower threshold voltage is measured on the voltmeter. For setting the upper threshold voltage, the voltmeter is coupled between TP8 and TP9. R17 is adjusted until a voltage corresponding to the upper threshold voltage is measured on the voltmeter. In the circuit shown, both lower and upper voltages can be adjusted between 2.3 and 5.4 volts. Generally the lower and upper voltage limits (that is, the "window") is set to the corresponding minimum and maximum acceptable values specified for the device being emulated.

Output of each comparator stage is coupled to a fault indicator stage 25. A fault high indication is registered at TP11 and visually by DS1, whenever the supply voltage under test exceeds the upper threshold voltage setting. A fault low indication is registered at TP12 and visually by DS2, whenever the supply voltage under test drops below the lower threshold voltage setting. Switches S2 and S3 are used to reset the fault indicators. The outputs at TP11 and TP12 can be readily coupled to external units for triggering an error indication.

Also shown in the circuit diagram are a voltage inverter and regulator stage 27, thermal sensor 26 and a decoupling capacitor 28. A power source, separate from that under test is coupled to provide power to the validator unit 10. In this particular embodiment, +12 volts is coupled to J1. A voltage inverter U6 taps the +12 V and supplies a −12 V to the circuit. The +12 V is also coupled to regulators for the generation of +10 V and VCC (of +5 V). Of course, these voltages are strictly a design choice.

The thermal sensor 26 in the circuit of FIG. 5A is a thermal switch S4, which is mounted on the heat sink 13. When power dissipation causes an excessively high temperature condition, the heat causes S4 to close, therein shorting the input to the current driver stage of converter/driver 23 to ground. The grounding out of the current drive signal reduces the load to a negligible value, near zero.

The decoupling capacitor 28 provides for the decoupling of VDD to VSS. In use, capacitor 28 is actually a plurality of capacitors distributed throughout the power plane on the circuit board 12 for providing the decoupling throughout the board 12. The purpose of having a plurality of capacitors is to emulate the expected package capacitance of the microprocessor being substituted.

In the event multiple processor systems are to be tested, a validator unit 10 can be substituted for each processor to validate the total processor power requirements on the system. In that event, each validator 10 would be set individually, but when functionally placed in the system, only one is utilized as the master unit. The one validator unit 10 selected as the master unit has its switch S1 set to the "MASTER" position. The other validators 10 have S1 set to the "SLAVE" position. A jumper wire is coupled from J4-1 on the master unit to J4-2 of the first slave unit. Another jumper wire then couples J4-3 of the first slave unit to J4-2 of the subsequent slave unit. This second connection is repeated for all subsequent slave units. Therefore, the pulses generated by the master unit are coupled to drive all of the validator units, such that all of the validator units 10 are driven synchronously to provide a total load on the supply under test.

Thus, a power validator tool of the present invention is described. It is to be noted that the validator can be readily adapted for performing a variety of tasks as well. For example, the validator 10 can be set or adjusted either in or out of the target system. When outside of the target system, a fixture (such as a jig) can be constructed to house the validator. The validator can be utilized to provide a simple indication or used to provide quantitative information which may be useful in diagnosing failed or marginal systems. It can also be used to check control loop resonance. Further, the various adjustments can be automated and controlled by a software routine by making design modifications to the existing validator design.

Furthermore, in reference to the circuit components noted in the schematic of FIGS. 5A–C, the combinations are endless in designing a circuit for the validator of the present invention. However, in order to show one working embodiment, the following component list is given. It is to be noted that the validator is not limited specifically to the component list.

Component values for the circuit of FIGS. 5A–C are as follows (all resistor values are in ohms and capacitor values are in uF, unless otherwise noted):

| U1 | NE556D | U2 | 74HCT04 |
|---|---|---|---|
| U3 | HA9P5221-5 | U4 | TLC277CD |
| U5 | MAX902CSD | U6 | LT1054CDW |
| VR1 | TL750L10CLP | VR2 | UA7805CKC |
| Q1,Q2 | 2N4401 | Q3,Q4 | 2N4403 |
| Q5 | IRFZ44 | D1 | 15V |
| R1 | 10.0K | R2 | 500, 20T |
| R3,R28 | 1K, 20T | R4 | 243 |
| R5 | 20.0K | R6 | 510 |
| R7,R8 | 5.1K | R9 | 1K |
| R10 | 1K | R11 | 0.005, 1%, 2W |
| R12 | 20K | R13 | 1K |
| R14 | 4.42K | R15 | 3.57K |
| R16,R17 | 50K, 20T | R18 | 2.21K |
| R19,R27 | 1.0K | R20,R26 | 1M, 20T |
| R21 | 180 | R22,R23 | 4.7K |
| R24,R25 | 1K | R29 | 5.1K |
| R30 | 20K 20T | C1–C4, C16–C19 | 0.001, 50V |
| C5,C6,C21–C29 | 0.10, 50V | C7 | 1000pF, 50V |
| C8,C13–C15,C30 | 22, 16V | C20 | 39pF, 50V |
| C9–C11 | 0.010, 50V | C12 | 0.0068, 50V |

We claim:

1. An apparatus utilized in place of an integrated circuit microprocessor to emulate a load placed on a power source by said integrated circuit microprocessor when present comprising:

a signal generator for generating a pulsed signal having a set frequency;

a current driver coupled to said power source for placing a dynamic load on said power source, said dynamic load emulating said load placed on said power source when said integrated circuit microprocessor is present;

said current driver also coupled to receive said pulsed signal from said signal generator in order to vary said dynamic load in response to said pulsed signal to emulate a current loading characteristic of said integrated circuit microprocessor;

a voltage sensor coupled to said power source for sensing voltage associated with said dynamic load and generating a fault indication signal when said voltage of said power source deviates from a set acceptable voltage range which corresponds to an acceptable supply voltage range for said integrated circuit microprocessor;

wherein said power source is tested to determine its response to a power requirement of said integrated circuit microprocessor by use of emulation and without actual use of said integrated circuit microprocessor.

2. The apparatus of claim 1 wherein said signal generator is capable of adjusting said set frequency.

3. The apparatus of claim 2 wherein said signal generator is capable of adjusting a duty cycle of said pulsed signal.

4. The apparatus of claim 3 wherein said current driver switches between a minimum load current value and a maximum load current value when varying in response to said pulsed signal and wherein said duty cycle determines a time period said current driver is at said maximum load current value.

5. The apparatus of claim 4 having a physical dimension and terminal connections for fitting into a socket reserved for said integrated circuit microprocessor.

6. A power validation apparatus utilized in place of an integrated circuit microprocessor to emulate a load placed on a power source by said integrated circuit microprocessor when present comprising:

a signal generator for generating a pulsed signal having a set frequency and wherein said set frequency can be adjusted within a predefined range;

a pulse adjusting circuit coupled to said signal generator for receiving said pulsed signal and adjusting a duty cycle of said pulsed signal;

a current driver coupled to said power source for placing a dynamic load on said power source, said dynamic load emulating said load placed on said power source when said integrated circuit microprocessor is present;

said current driver being adjustable to set minimum and maximum load current values to emulate dynamic range of said integrated circuit microprocessor;

said current driver also coupled to receive said duty cycle adjusted, pulsed signal from said pulse adjusting circuit in order to switch said dynamic load between said minimum and maximum load current values in response to said duty cycle adjusted, pulsed signal, wherein said duty cycle determines a time period said current driver is at said maximum load current value;

a voltage comparator coupled to said power source for sensing voltage associated with said dynamic load;

said voltage comparator being adjustable to set lower and upper threshold voltage levels and generating a fault indication signal when said voltage from said power source deviates outside of said set lower and upper threshold voltage levels which corresponds to an acceptable supply voltage range for said integrated circuit microprocessor;

wherein said power source is tested to determine its response to a power requirement of said integrated circuit microprocessor by use of emulation and without actual use of said integrated circuit microprocessor.

7. The power validation apparatus of claim 6 wherein said current driver includes a voltage to current converter circuit for converting said duty cycle adjusted, pulsed signal to drive said dynamic load.

8. The power validation apparatus of claim 7 wherein said current driver includes a push-pull stage driving a field-effect-transistor dynamic load.

9. The power validation apparatus of claim 8 having a physical dimension and terminal connections for fitting into a socket reserved for said integrated circuit microprocessor.

10. A method of validating a power source, which is used to supply power to an integrated circuit microprocessor, without having said integrated circuit microprocessor actually coupled to said power source, but where a power requirement of said integrated circuit on said power source is emulated, comprising the steps of:

providing a validation tool that places a dynamic load on said power source in order to emulate a load placed on said power source by said integrated circuit microprocessor when present;

adjusting a signal generator of said validation tool to generate a pulsed signal having a set frequency;

adjusting minimum and maximum load current values of a current driver of said validation tool coupled to said power source in order to switch said dynamic load between said minimum and maximum load current values to emulate a current loading characteristic of said integrated circuit microprocessor, said switching being in response to said pulsed signal coupled from said signal generator;

adjusting lower and upper threshold levels of a voltage sensor of said validation tool coupled to said power source, in order to sense voltage associated with said dynamic load said threshold levels corresponding to an acceptable supply voltage range for said integrated circuit microprocessor;

providing an indication of fault when said voltage of said power source deviates outside of said lower and upper threshold voltage levels wherein said power source is tested to determine its response to a power requirement of said integrated circuit microprocessor by use of emulation and without actual use of said integrated circuit microprocessor.

11. The method of claim 10 further comprising the step of adjusting a duty cycle of said pulsed signal, wherein said duty cycle determines a time period said current driver is at said maximum load current value.

12. The method of claim 11 wherein said validation tool is inserted in a socket reserved for said integrated circuit microprocessor to perform said validation.

* * * * *